(12) United States Patent
Sandlin et al.

(10) Patent No.: US 7,175,802 B2
(45) Date of Patent: Feb. 13, 2007

(54) REFURBISHING SPENT SPUTTERING TARGETS

(75) Inventors: Michael Sandlin, Gilbert, AZ (US); Wenjun Zhang, Tucson, AZ (US); Bernd Kunkel, Phoenix, AZ (US)

(73) Assignee: Heraeus, Inc., Chandler, AZ (US)

( * ) Notice: Subject to any disclaimer, the term of this patent is extended or adjusted under 35 U.S.C. 154(b) by 0 days.

(21) Appl. No.: 10/243,948

(22) Filed: Sep. 16, 2002

(65) Prior Publication Data

US 2003/0077199 A1    Apr. 24, 2003

Related U.S. Application Data

(60) Provisional application No. 60/322,429, filed on Sep. 17, 2001.

(51) Int. Cl.
*C23C 14/34* (2006.01)
*B22F 7/00* (2006.01)

(52) U.S. Cl. .............. 419/8; 419/30; 419/32; 419/48; 419/49; 204/298.12; 204/298.13

(58) Field of Classification Search ......... 204/298.12, 204/298.13; 427/140, 216, 217, 289, 372.2, 427/383.7; 432/13, 9; 148/513, 121; 419/8, 419/30, 32, 48, 49
See application file for complete search history.

(56) References Cited

U.S. PATENT DOCUMENTS

| | | | |
|---|---|---|---|
| 4,341,816 A | 7/1982 | Lauterbach et al. | 427/456 |
| 5,160,675 A | 11/1992 | Iwamoto et al. | 264/645 |
| 5,342,496 A | 8/1994 | Stellrecht | 204/298.12 |
| 5,428,882 A | 7/1995 | Makowiecki et al. | 29/527.5 |
| 6,409,965 B1 * | 6/2002 | Nagata et al. | 419/26 |
| 2002/0112955 A1 * | 8/2002 | Aimone et al. | 204/298.12 |

FOREIGN PATENT DOCUMENTS

| | | |
|---|---|---|
| JP | 62-230967 | 10/1987 |
| JP | 63-093859 | 4/1988 |
| JP | 05-065635 | 3/1993 |
| JP | 05-148631 | 6/1993 |
| JP | 11-286776 | 10/1999 |
| JP | 2000-38661 | 2/2000 |
| JP | 2000-038661 | * 2/2000 |

OTHER PUBLICATIONS

Handbook of Chemistry and Physics, 49th Ed., p. D-103 (1968).*
PCT Search Report in PCT/US02/29246.
Korean Office Action dated Nov. 28, 2005.
Notice of Decision for Final Rejection, Korean Intellectual Property Office, Appl. No. 10-2004-7003873, Refurbishing Spent Sputtering Targets, Apr. 6, 2006 (Korean and English Translation).
Magnetron Sputter Target Material for Recording Medium, Xue Han, et al. Rare Metal, vol. 21 (5), Sep. 1997, pp. 366-370. (Chinese).

(Continued)

*Primary Examiner*—Rodney G. McDonald
(74) *Attorney, Agent, or Firm*—McDermott Will & Emery LLP

(57) ABSTRACT

Spent sputtering targets are refurbished by filling the depleted region of the target with new sputter material using a hot isostatic pressing or HIP'ing technique.

6 Claims, 2 Drawing Sheets

OTHER PUBLICATIONS

The Progress of Nanometer Thin Film Research, Qiangyong Li, Vacuum & Cryogenics, vol. 13 (3), Sep. 1994, pp. 162-168. (Chinese with English-language abstract).

Xue Han, et al. "Magnetron Sputtering Target Material for Recording Medium," Rare Metal, vol. 21 (5), Sep. 1997, pp. 366-370. (English Translation).

Li Qiangyong (Lanzhou Institute of Physics), "The Progression of Nanometer Thin Film Research," Vacuum & Cryogenics, vol. 13 (3), Sep. 1994, pp. 162-168. (English Translation).

* cited by examiner

REFURBISHING SPENT SPUTTERING TARGETS

RELATED APPLICATIONS

This application claims the benefit of U.S. provisional application No. 60/322,429, entitled "REFURBISHING SPENT SPUTTERING TARGETS" filed on Sep. 17, 2001 by Michael Sandlin, the disclosure of which is incorporated herein by reference.

FIELD OF THE INVENTION

The invention is directed to refurbishing a spent sputtering target. The target is refurbished by filling an erosion groove in the spent sputtering target with new sputter material that was depleted during the sputtering process. As a result, the spent sputtering target is reprocessed.

BACKGROUND OF THE INVENTION

Cathodic sputtering is widely used for the deposition of thin layers of material onto desired substrates. A typical sputtering system includes a plasma source for generating an electron or ion beam, a target that comprises a material to be atomized, and a substrate onto which the sputtered material is deposited. The process involves bombarding the target material with the electron or ion beam at an angle that causes the target material to be sputtered or eroded off the target. The sputtered target material is deposited as a thin film on the substrate. Eventually, an erosion groove is formed in the sputtering target where the sputter material has been depleted.

In many sputtering applications, only a small fraction (25–40%) of the typical target material is utilized. Normally after the sputter target is spent, it is discarded, remelted, or refined. Refurbishing spent targets offers the potential of significant cost reduction through increasing end-to-end material yields, and reducing the carrying cost of precious metal inventory. Hence, there is competitive advantage to be gained by suppliers who can effectively refurbish spent sputter targets. The method for refurbishing targets can be simply stated as filling the erosion groove with new sputter material and reprocessing the target using a hot isostatic pressing or HIP'ing technique.

SUMMARY OF THE INVENTION

The invention is a plasma vapor deposition (PVD) sputtering target design comprising two regions that are functionally and compositionally distinct. As shown in FIG. 1, region 2 in the target 1 is referred to as the sputter material, and region 3 is referred to as the support structure. The function of the sputter material is to be transferred during the sputtering application from the target to the surface of the sputtering substrate. The function of the support material is to support the sputter material prior to and during application. Since the support material is not sputtered during application, it can be recycled and used to manufacture a refurbished sputtering target. The two regions are compositionally distinct. In some cases, the composition of the support material will comprise different atomic species than the sputter material, and in other cases the compositions will vary only slightly in the atomic concentrations of the same atomic species.

In the invention, the interface geometry between the support material and the sputter material is designed to minimize the amount of sputter material necessary for use in sputtering applications. The optimum design for the interface geometry corresponds to the natural sputter erosion groove or sputter profile of a spent sputtering target, which is created while being used in a given sputtering application. Therefore, the key design concept is that the interface geometry between the support material and sputter material approximates the applicable sputter profile. This design allows the sputter material to be almost completely utilized in application. This is particularly important when the sputter material is expensive.

Due to the nature of the desired interface geometry, the preferred route to fabricate the design is to employ a spent target as the support material, fill the erosion groove with new material, and reprocess the target using appropriate methods and conditions. In principle, the repossessed target can be thought of as a refurbished spent sputtering target. By refurbished spent sputtering target, it is meant a previously used sputtering target in which the erosion groove is filled with new sputter material. It should be noted that the design concept still applies in the case where the sputter profile or erosion groove in the support material article is created via conventional machining operations, and the support material chemistry is distinct from the sputter material. The specific geometry of the support material will necessarily vary with application specific sputtering target design requirements, but the concept is simple and consistent.

BRIEF DESCRIPTION OF THE DRAWINGS

The various novel features of this invention alone with the foregoing and other objects as well as the invention itself, may be more fully understood from the following description of the illustrated embodiments when read in conjunction with the accompanying drawings.

DETAILED DESCRIPTION OF THE INVENTION

Figure 1:
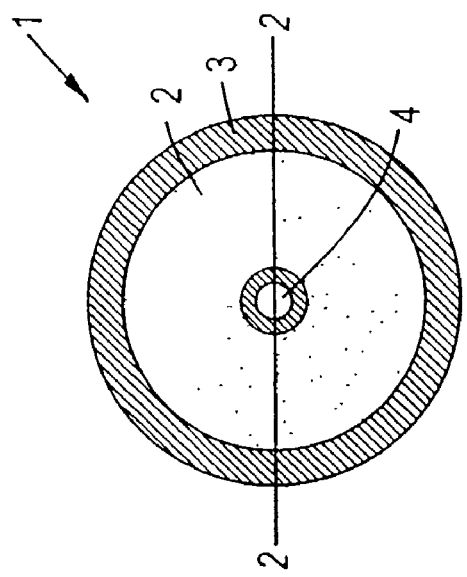
FIG. 1 is a top view of one embodiment of the target of the invention which is a disc shaped target having a circular sputter profile.
Figure 3:
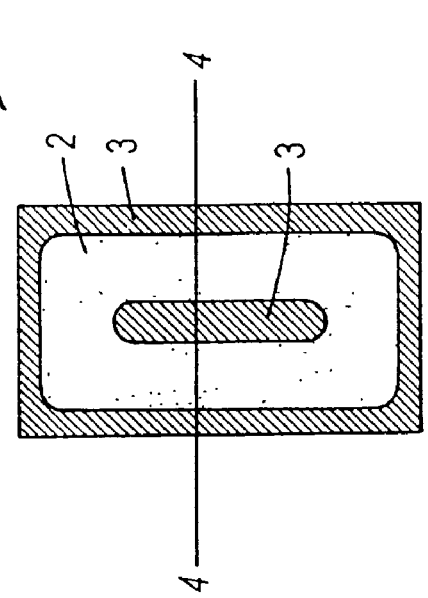
FIG. 3 is a top view of another embodiment of the target of the invention which is a plate shaped target having a rectangular sputter profile.
Figure 2:
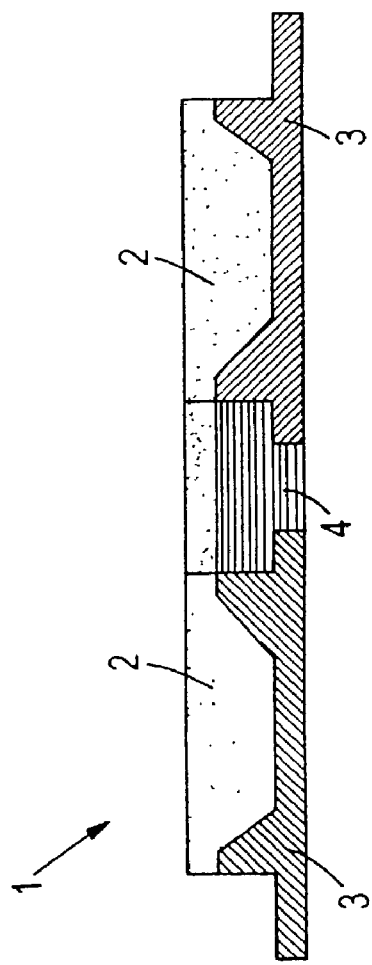
FIG. 2 is a cross-section view of the disc shaped target embodiment.
Figure 4:
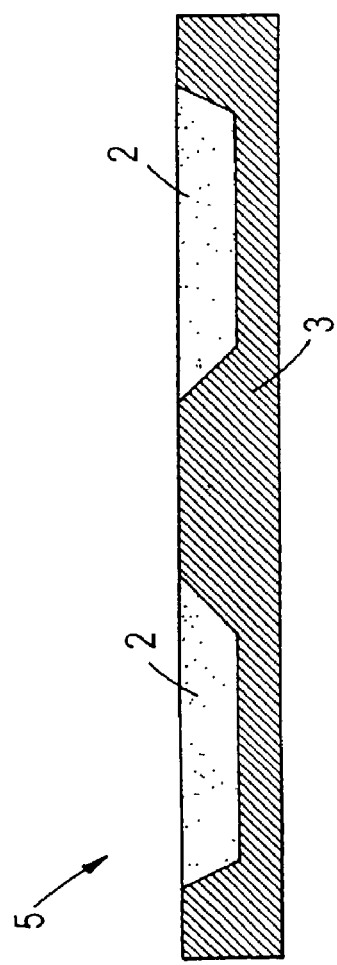
FIG. 4 is a cross-section view of the plate shaped target embodiment.

FIGS. 1 and 3 show typical geometries of the sputtering targets. FIG. 1 shows a disc shaped sputtering target having a circular sputter profile. In particular, the sputter material 2 is formed on a support structure 3. As illustrated in FIGS. 1 and 2, the target 1 is circular and donut shaped. The support structure 3 and sputter material 2 are concentric and are formed around hole 4 in the center of the target. Also, the sputtering target can be rectangular in shape as shown in FIGS. 3 and 4 where the sputtering target 5 has a profile that is rectangular.

The support structure 3 can be a material selected from the group consisting of Cu, CoCr alloy, stainless steel, NiAl alloy, W, Mo, CoCrPtB alloy, or RuAl alloy and PtMn alloy. The sputter material 2 can be a magnetic or non-magnetic material such as an alloy containing Co, Cr, Cu, Ni, Al, Mo, Pt, Ru, Pd, Re, Rh, Au or Ag metal. Examples of such alloys include RuAl and PtMn. The new sputter material is diffusion bonded to the support structure using a HIP unit. The support material can be sputter materials such as Co, 25 at % or Co, 20 at % Cr, 1.5 at % Pt, 6 at % B.

The HIP unit is used in the powder consolidation step of powder processing. This processing step is well known in the powder metals industry. The process of the invention is as follows.

The erosion groove of the spent target may contain some minor surface defects. Therefore, the target may need to be cleaned by shotblasting. However, as a condition of the invention, it is not necessary to clean the spent targets.

Figure 5:
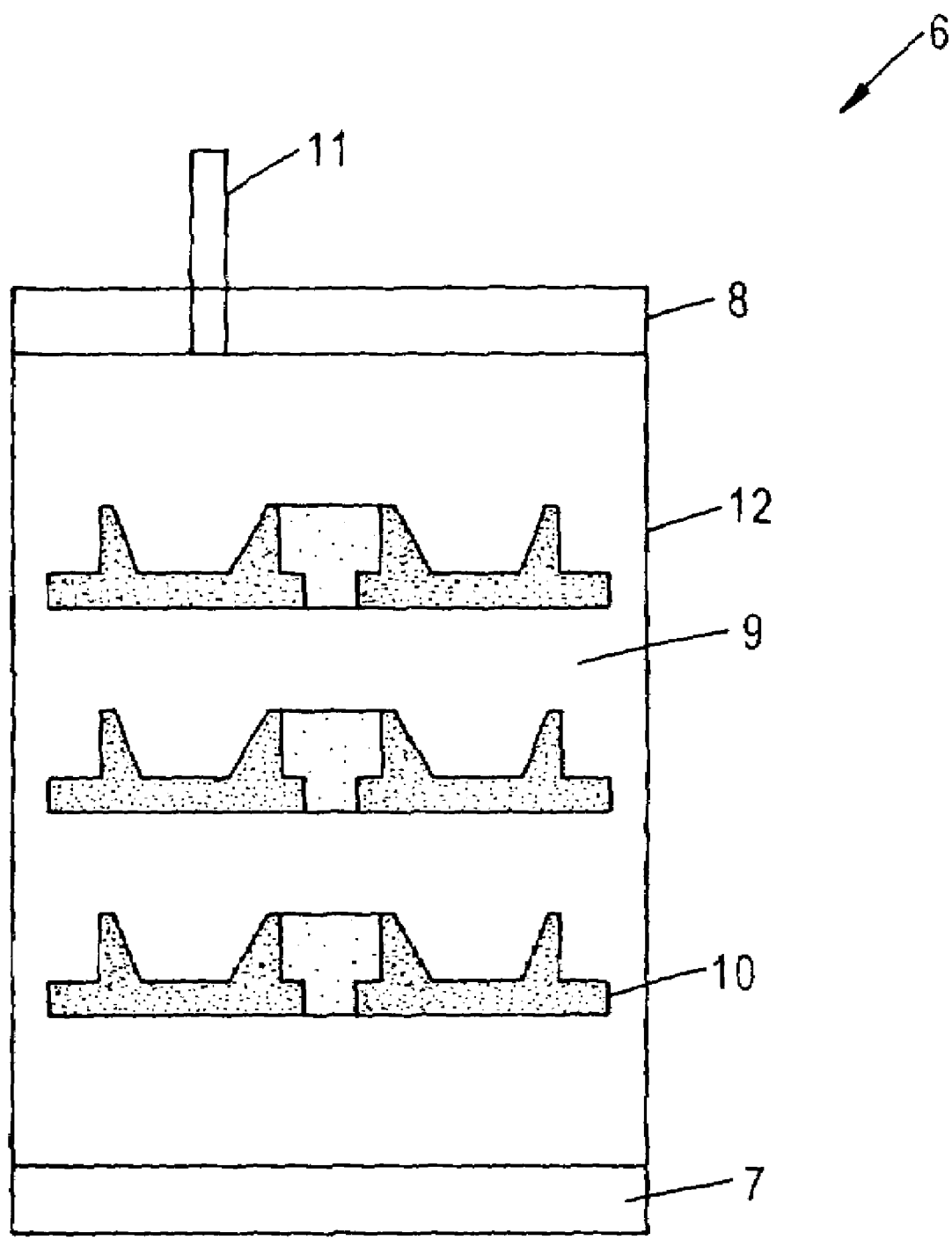
FIG. 5 is a schematic of a steel cylindrical can used during the hot isostatic pressing (HIP) in filling the erosion groove of the spent target with new sputter material.

A blended metal powder 9 of the new sputter material is poured into an empty steel cylindrical can 6 as shown in FIG. 5. The can includes a cylindrical body 12, a sealed bottom cover 7 and a top cover 8. The can is filled with the blended metal powder 9 to about 1" of height in the cylinder. The blended powder can be a mixture of alloy powders. A spent target 10 is placed on the bed of powder in the HIP can. Then more powder is poured into the can such that the spent target is covered. The coverage of the powder is extended above the top to the solid metal piece by about 1" in height. The spent target is essentially buried. Another spent target can be placed on the bed of the powder and the process is repeated until the HIP can is full of powder and other spent targets are buried. The spent targets are spaced vertically, about an inch apart. FIG. 5 for example shows three spent targets in the cylindrical can.

The top cover 8 is placed on the cylindrical can. The can is then hermetically sealed under vacuum by drawing a vacuum through evacuation tube 11. The cylindrical can is placed into a HIP vessel (not shown in the drawing), which is also sealed except for a gas inlet. Argon gas is introduced into the HIP vessel via a high pressure gas pump.

The cylindrical can is heated inside of the HIP pressure vessel using resistance heated coils within the HIP unit. The can is heated to between about 1850° and about 1950° F., at 15 KSI, for about 4 hours. This step is referred to as HIP'ing. As the temperature and pressure rise within the HIP unit, the steel container begins to deform and compress the blended powder until ultimately all of the powder is completely densified into the spent targets. The blended metal powder is consolidated and diffusion bonded to the support structure of the spent sputter target.

The HIP can, which is now diffusion bonded to the consolidated material, is removed by machining. In general, after the HIP'ing step, the powder is in the form of a solid metal cylinder or block. The disk shaped refurbished sputtering targets are then fabricated from the solid block by sawing and milling operations. The entire cylindrical can and the consolidated material is sliced into disks using a band saw. The remnants of steel cylindrical can (which looks like a ring around the diameter of the consolidated material after slicing) is taken off using a lathe or water jet. The consolidated material is then machined into a sputtering target using a lathe.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

We claim:

1. A method of refurbishing a sputter target comprising the steps of:
   (a) blending a powder of metal alloys to form a blend of metal alloy powders to produce a new sputter material,
   (b) adding said metal alloy powders to a metal can to form a powdered layer,
   (c) placing a spent sputter target having an erosion groove on said powdered layer,
   (d) covering said spent sputter target with said metal alloy powders to form a second powdered layer,
   (e) sealing said metal can, and
   (f) subjecting said metal can to pressure and heat to consolidate and diffuse said metal alloy powders into and fill said erosion groove and form said new sputter material in said erosion groove.

2. The method of claim 1, wherein said support structure is a material selected from the group consisting of a CoCrPtB alloy, Cu, stainless steel, a NiAl alloy, a CoCr alloy, Al, W and Mo.

3. The method of claim 1, wherein said new sputter material contains platinum and a magnetic material.

4. The method of claim 1, wherein said new sputter target material contains a metal selected from a group consisting of Pt, Ru, Pd, Re, Rh, Au and Ag.

5. The method of claim 1 wherein said method repeats steps (c) and (d) to add one or more additional spent metal targets to be refurbished.

6. The method of claim 1, wherein said method further includes the steps of sawing and machining the product of step (f) to form a refurbished sputter target.

* * * * *

UNITED STATES PATENT AND TRADEMARK OFFICE
CERTIFICATE OF CORRECTION

PATENT NO. : 7,175,802 B2 Page 1 of 1
APPLICATION NO. : 10/243948
DATED : February 13, 2007
INVENTOR(S) : Sandlin et al.

It is certified that error appears in the above-identified patent and that said Letters Patent is hereby corrected as shown below:

ON THE COVER PAGE, item

(75) Inventors: "Wenjun Zhang, Tuscon, AZ" should read --Wenjun Zhang, Gilbert, AZ--

Signed and Sealed this

Eighth Day of April, 2008

JON W. DUDAS
*Director of the United States Patent and Trademark Office*